(12) United States Patent
Zhang et al.

(10) Patent No.: US 9,807,906 B2
(45) Date of Patent: Oct. 31, 2017

(54) LIQUID-COOLING DEVICE AND SYSTEM THEREOF

(71) Applicant: ASIA VITAL COMPONENTS CO., LTD., New Taipei (TW)

(72) Inventors: Rong-Xian Zhang, New Taipei (CN); Jian-Wu Yin, New Taipei (CN)

(73) Assignee: Asia Vital Components Co., Ltd., New Taipei (TW)

(*) Notice: Subject to any disclaimer, the term of this patent is extended or adjusted under 35 U.S.C. 154(b) by 166 days.

(21) Appl. No.: 14/804,298

(22) Filed: Jul. 20, 2015

(65) Prior Publication Data

US 2017/0027081 A1 Jan. 26, 2017

(51) Int. Cl.
*F28D 15/00* (2006.01)
*H05K 7/20* (2006.01)
*H01L 23/473* (2006.01)

(52) U.S. Cl.
CPC ....... *H05K 7/20272* (2013.01); *H01L 23/473* (2013.01); *H05K 7/20254* (2013.01)

(58) Field of Classification Search
CPC ............ H05K 7/20272; H05K 7/20254; H01L 23/473; F28D 15/00; F28F 23/00
USPC .................................................... 165/104.31
See application file for complete search history.

(56) References Cited

U.S. PATENT DOCUMENTS

| | | | |
|---|---|---|---|
| 8,245,764 B2 | 8/2012 | Eriksen | |
| 2005/0069432 A1 | 3/2005 | Tomioka | |
| 2007/0039719 A1* | 2/2007 | Eriksen | G06F 1/20 165/104.31 |
| 2013/0287561 A1* | 10/2013 | Block | F04D 29/426 415/208.1 |

FOREIGN PATENT DOCUMENTS

| | | |
|---|---|---|
| CN | 1160845 A | 10/1997 |
| CN | 102736711 A | 10/2012 |
| TW | 201040480 A1 | 11/2010 |
| TW | M454564 U1 | 6/2013 |
| TW | M481581 U | 7/2014 |

* cited by examiner

*Primary Examiner* — Davis Hwu
(74) *Attorney, Agent, or Firm* — C. G. Mersereau; Nikolai & Mersereau, P.A.

(57) ABSTRACT

A liquid-cooling device and a liquid-cooling system thereof. The liquid-cooling device includes a liquid reservoir case having a heat exchange chamber for a cooling liquid to pass through. An impeller and multiple radiating fins in adaptation to the impeller are disposed in the heat exchange chamber. The impeller serves to drive the cooling liquid to circularly flow through the radiating fins so as to efficiently dissipate heat generated by a heat generation component.

9 Claims, 14 Drawing Sheets

LIQUID-COOLING DEVICE AND SYSTEM THEREOF

BACKGROUND OF THE INVENTION

1. Field of the Invention

The present invention relates generally to a liquid-cooling device.

2. Description of the Related Art

When an electronic device works, the CPU or the other processor will generate heat. The heat must be quickly and efficiently dissipated. Currently, the most widely used cooling means for the CPU or the other processor is mainly an air-cooling device. The air-cooling device employs a heat sink and cooling fan as the heat dissipation means. Another type of cooling device that utilizes a cooling liquid to cool the CPU or the other processor has been developed. For example, U.S. Pat. No. 8,245,764 discloses a cooling system for heat generation component. The cooling system includes a double-faced base seat for receiving a pump to circulate a cooling liquid. The pump includes a stator and an impeller. The impeller is disposed on the bottom side of the base seat. The stator is disposed to the top side of the base seat and isolated from the cooling liquid. A cooling system further includes a liquid reservoir chamber for the cooling liquid to pass therethrough. The liquid reservoir includes a pump chamber formed on lower side of the base seat, in which the impeller is disposed. At least one impeller cover body defines the pump chamber. The impeller cover body has one or more flow passages for the cooling liquid to pass through. A heat exchange chamber is formed under the pump chamber and perpendicularly separated from the pump chamber. The pump chamber and the heat exchange chamber are separate chambers and communicate with each other through one or more passages. A heat exchange interface is formed on one side of the heat exchange chamber in contact with a heat generation component. A heat sink is flowably connected to the liquid reservoir chamber. The cooling liquid serves to carry away the heat of the heat sink. Also, U.S. Patent Publication No. 20050069432A1 discloses an electronic device with a pump. The electronic device includes a liquid reservoir case having a heat generation component. A heat dissipation section serves to dissipate the heat generated by the heat generation component. The electronic device further includes a pump unit having an impeller and a heat absorption section thermally connected to the heat generation component. The impeller of the pump unit rotates to supply cooling liquid to the heat dissipation section. The cooling liquid circulates in a circulation path between the heat absorption section and the heat dissipation section, whereby the heat generated by the heat generation component can be transferred to the heat dissipation section via the cooling liquid. The center of the impeller of the pump unit and the center of the heat generation component are separately disposed. The conventional water-cooling system includes numerous components and the structures between the components are apt to damage. The damage of the structures often leads to the problem of leakage of the water.

SUMMARY OF THE INVENTION

It is therefore a primary object of the present invention to provide a liquid-cooling device and a liquid-cooling system thereof. The liquid-cooling device includes a pump and multiple radiating fins received in one single heat exchange chamber. Therefore, the volume of the liquid-cooling device of the present invention is much smaller than the volume of the conventional liquid-cooling device. Moreover, the cooling efficiency of the liquid-cooling device of the present invention is higher than that of the conventional liquid-cooling device. Furthermore, the manufacturing cost of the liquid-cooling device of the present invention is lower than that of the conventional liquid-cooling device so that the yield can be increased.

It is a further object of the present invention to provide the above liquid-cooling device and liquid-cooling system, in which the impeller is disposed in a position spaced from the central region of the heat exchange chamber and the radiating fins are positioned in adaptation to the impeller. Accordingly, the cooling liquid driven by the impeller can quickly circularly pass through the radiating fins.

To achieve the above and other objects, the liquid-cooling device of the present invention includes: a liquid reservoir case having a heat exchange chamber, an inlet and an outlet, the inlet and the outlet being in communication with the heat exchange chamber, the heat exchange chamber being for a cooling liquid to pass through; a pump component for circulating the cooling liquid, the pump component including a stator, a rotor and an impeller connected with the rotor, the rotor and the impeller being disposed in the heat exchange chamber in a position spaced from a central region of the heat exchange chamber, the impeller being positioned in adjacency to the inlet and exposed to the cooling liquid in the heat exchange chamber; and a heat exchange component connected with the liquid reservoir case as a bottom side of the heat exchange chamber, the heat exchange component having a heat contact face and a heat exchange face in contact with the cooling liquid in the heat exchange chamber, the heat exchange face being defined with a water incoming section corresponding to the impeller, multiple radiating fins being disposed on the rest section of the heat exchange face.

In the above liquid-cooling device, the liquid reservoir case has a top board serving as a top side of the heat exchange chamber opposite to the heat exchange component, the heat exchange chamber being positioned between the top board and the heat exchange component.

In the above liquid-cooling device, the radiating fins are radially arranged at intervals, each radiating fin having a first end directed to the impeller and a second end radially extending away from the water incoming section.

In the above liquid-cooling device, each radiating fin has a waved form extending from the first end to the second end.

In the above liquid-cooling device, the radiating fins respectively have unified or different heights.

In the above liquid-cooling device, the heat exchange face of the heat exchange component is formed with multiple flow guide channels between each two adjacent radiating fins.

In the above liquid-cooling device, a first sealing component is disposed between the liquid reservoir case and the cover body and a second sealing component is disposed between the liquid reservoir case and the heat exchange component.

In the above liquid-cooling device, the stator is disposed outside the heat exchange chamber and the top board serves to isolate the cooling liquid in the heat exchange chamber from the stator.

In the above liquid-cooling device, the stator is disposed in the heat exchange chamber and positioned on the heat exchange face of the heat exchange component.

The liquid-cooling system of the present invention includes: a liquid reservoir case having a heat exchange chamber, an inlet and an outlet, the inlet and the outlet being in communication with the heat exchange chamber, the heat exchange chamber being for a cooling liquid to pass through; a pump component for circulating the cooling liquid, the pump component including a stator, a rotor and an impeller connected with the rotor, the rotor and the impeller being disposed in the heat exchange chamber in a position spaced from a central region of the heat exchange chamber, the impeller being positioned in adjacency to the inlet and exposed to the cooling liquid in the heat exchange chamber; a heat exchange component connected with the liquid reservoir case as a bottom side of the heat exchange chamber, the heat exchange component having a heat contact face and a heat exchange face in contact with the cooling liquid in the heat exchange chamber, the heat exchange face being defined with a water incoming section corresponding to the impeller, multiple radiating fins being disposed on the rest section of the heat exchange face; and a heat sink connected with the liquid reservoir case for dissipating the heat of the cooling liquid.

In the above liquid-cooling system, the heat sink is connected with the liquid reservoir case by means of flexible pipes and the heat sink is positioned in a position distal from the liquid reservoir case.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
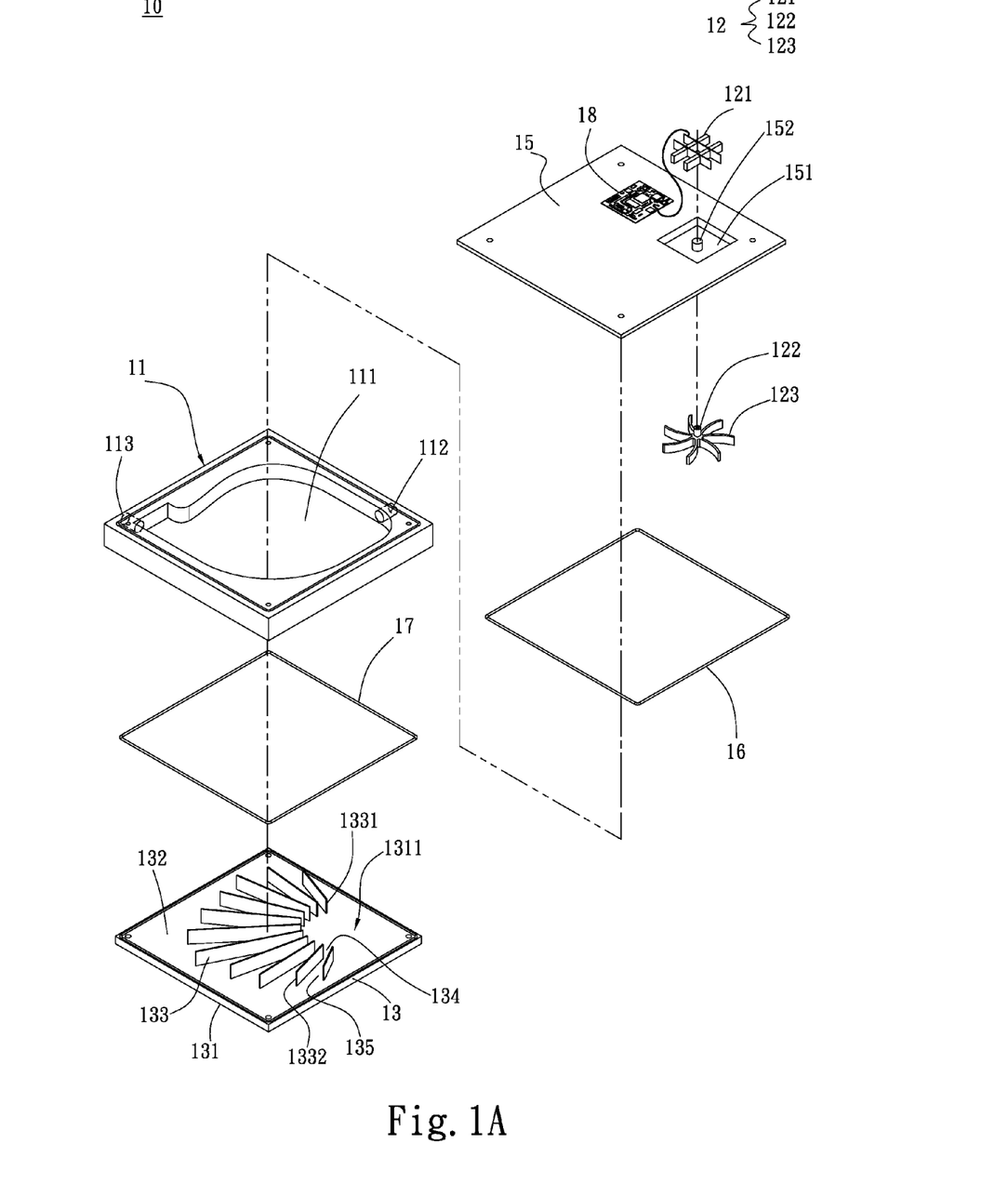
FIG. 1A is a perspective exploded view of a first embodiment of the present invention.
Figure 1B:
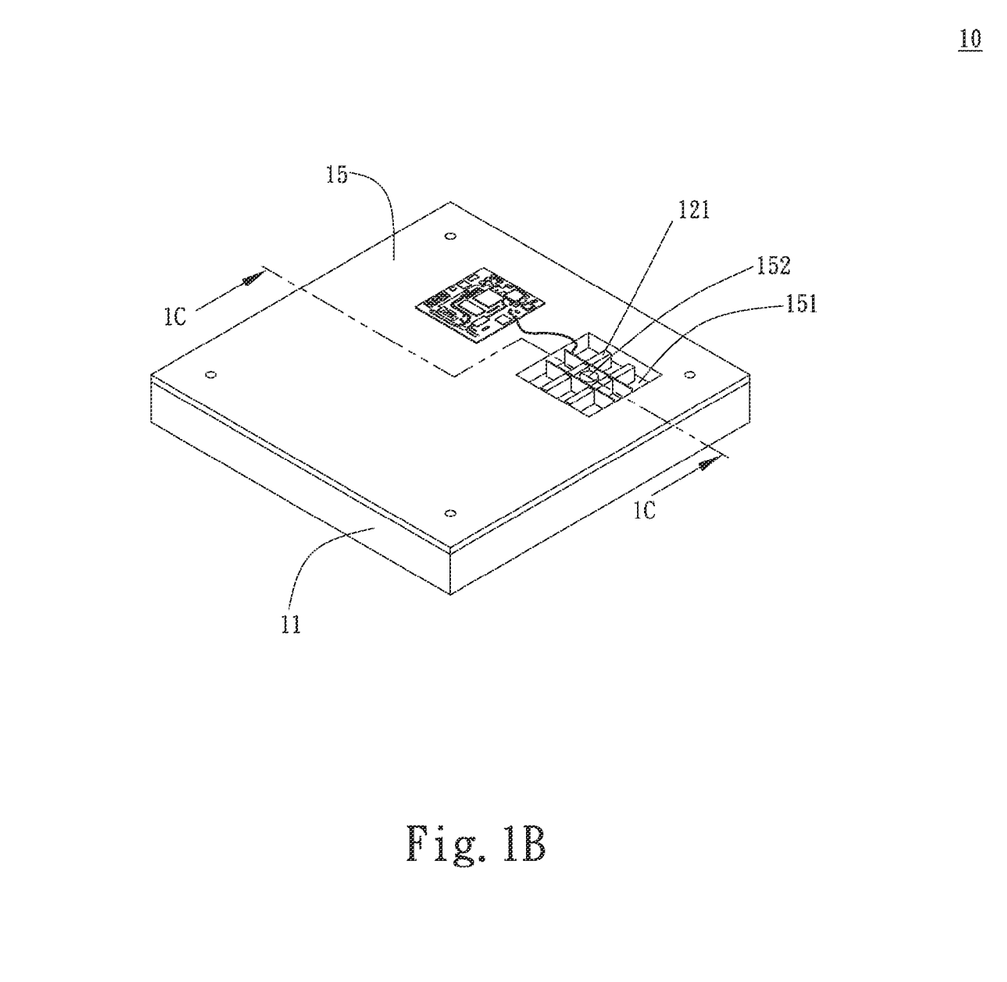
FIG. 1B is a perspective assembled view of the first embodiment of the present invention.
Figure 1C:
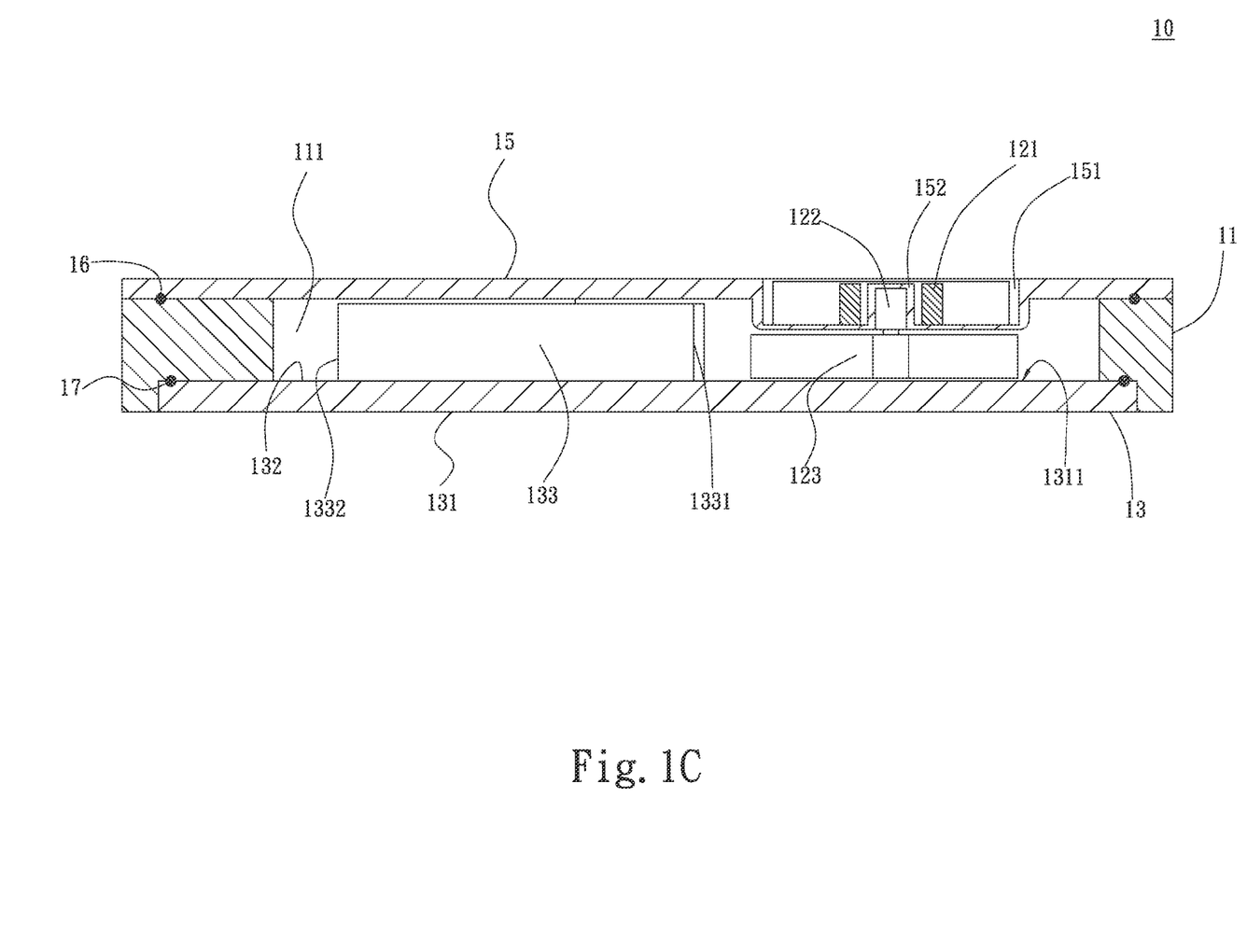
FIG. 1C is a sectional view of the first embodiment of the present invention.

Please refer to FIGS. 1A, 1B and 1C. FIG. 1A is a perspective exploded view of a first embodiment of the present invention. FIG. 1B is a perspective assembled view of the first embodiment of the present invention. FIG. 1C is a sectional view of the first embodiment of the present invention. According to the first embodiment, the liquid-cooling device 10 of the present invention includes a liquid reservoir case 11, a pump component 12 and a heat exchange component 13. The liquid reservoir case 11 has a heat exchange chamber 111, an inlet 112 and an outlet 113. The heat exchange chamber 111 is formed in the liquid reservoir case 11 for a cooling liquid to pass through. The inlet 112 and the outlet 113 are formed through the lateral sides of the liquid reservoir case 11 in communication with the heat exchange chamber 111. For example, the inlet 112 and the outlet 113 are, but not limited to, positioned on the obliquely opposite corners of the liquid reservoir case 11. Such arrangement can make the inlet 112 and the outlet 113 spaced from each other by a longest linear distance. The cooling liquid flows into the heat exchange chamber 111 through the inlet 112 and then flows out of the heat exchange chamber 111 through the outlet 113. The liquid reservoir case 11 has a top board 15 serving as a top side of the heat exchange chamber 111. In this embodiment, the top board 15 and the liquid reservoir case 11 are separate components. The top board 15 is connected with the liquid reservoir case 11 as a part of the liquid reservoir case 11. The top board 15 can be connected with the liquid reservoir case 11 by means of screwing, adhesion, welding or any other easily available connection means. A first gasket 16 is positioned between the top board 15 and the liquid reservoir case 11. Alternatively, the top board 15 is integrally formed on the liquid reservoir case 11 as a part thereof. This can save the gasket. The liquid reservoir case 11 and the top board 15 can be made of metal or plastic material.

The pump component 12 includes a stator 121, a rotor 122 and an impeller 123. The rotor 122 is connected with the impeller 123. The rotor 122 and the impeller 123 are disposed in the heat exchange chamber 111 in a position spaced from a central region of the heat exchange chamber 111. The impeller 123 is positioned in adjacency to the inlet 112 and exposed to the cooling liquid of the heat exchange chamber 111. The stator 121 is disposed outside the heat exchange chamber 111. The top board 15 serves to isolate the cooling liquid in the heat exchange chamber 111 from the stator 121. In this embodiment, the top board 15 is formed with a recess 151 for receiving the stator 121 therein. A raised hollow cylindrical section 152 is disposed in the recess 151 for receiving the rotor 122 in the heat exchange chamber 111. Accordingly, the stator 121 is separated from the rotor 122 by the top board 15 to correspondingly drive the rotor 122 to rotate the impeller 123. The stator 121 is further connected with a circuit board 18 for achieving electrical power to generate magnetic field. For example, the circuit board 18 is, but not limited to, disposed on the top board 15 on the same side as the stator 121.

The heat exchange component 13 can be connected with the liquid reservoir case 11 by means of such as screwing, welding or adhesion as a part of the liquid reservoir case 11 or a bottom side of the heat exchange chamber 111. The heat exchange chamber 111 is positioned between the top board 15 and the heat exchange component 13. A second gasket 17 is disposed between the liquid reservoir case 11 and the heat exchange component 13 to enhance the connection tightness between the liquid reservoir case 11 and the heat exchange component 13 and prevent the cooling liquid of the heat exchange chamber 111 from leaking. The heat exchange component 13 is made of high-heat-conductivity metal such as aluminum, copper, gold or silver. The heat exchange component 13 has a heat contact face 131 in contact with a heat generation component and a heat exchange face 132 in contact with the cooling liquid in the heat exchange chamber 11. Accordingly, the heat generated by the heat generation component can be transferred through the heat exchange component 13 to the cooling liquid in the heat exchange chamber 111.

Moreover, the heat exchange face 132 is defined with a water incoming section 1311 corresponding to the impeller 123. Multiple radiating fins 133 are disposed on the rest section of the heat exchange face 132. The radiating fins 133 are radially arranged at intervals. Each radiating fin 133 has a first end 1331 directed to the impeller 123 and a second end 1332 radially extending away from the water incoming section 1311. When the impeller 123 rotates to disturb the cooling liquid in the heat exchange chamber 111, the cooling liquid is driven by the impeller 123 to flow through the radiating fins 133 and then flow out from the outlet 113.

Figure 2A:
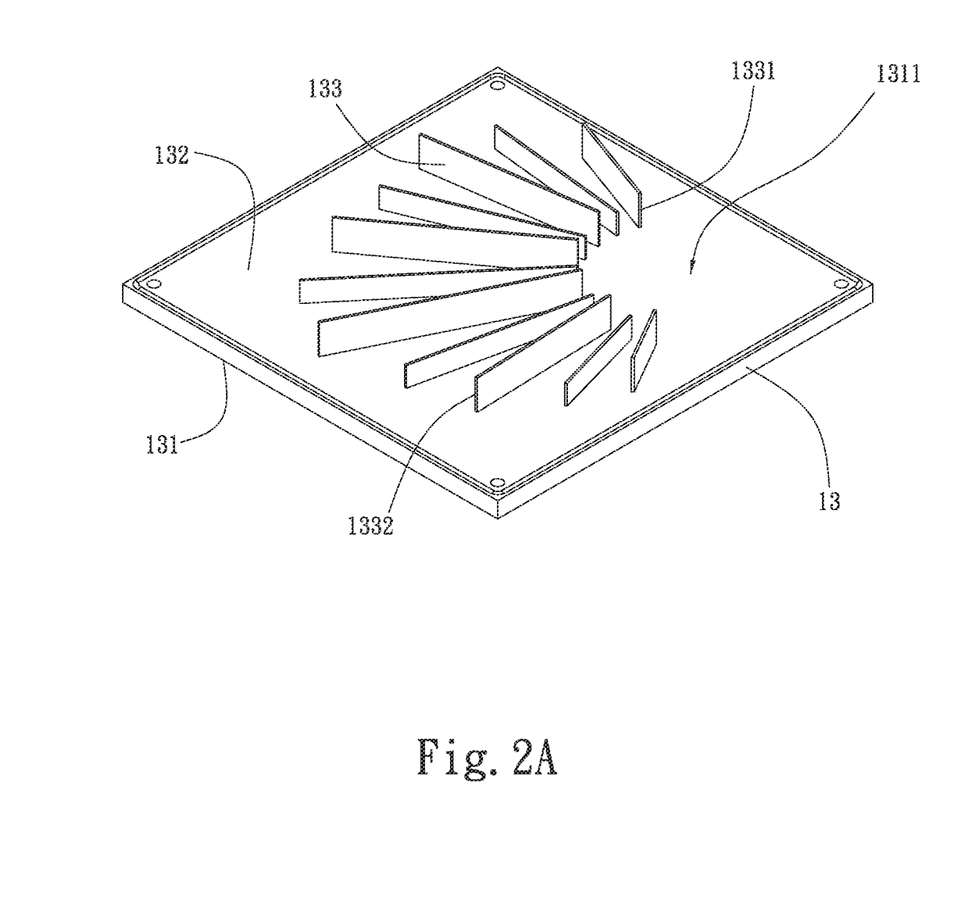
FIGS. 2A~2D are perspective views showing some other forms of heat exchange components of the present invention.
Figure 2B:
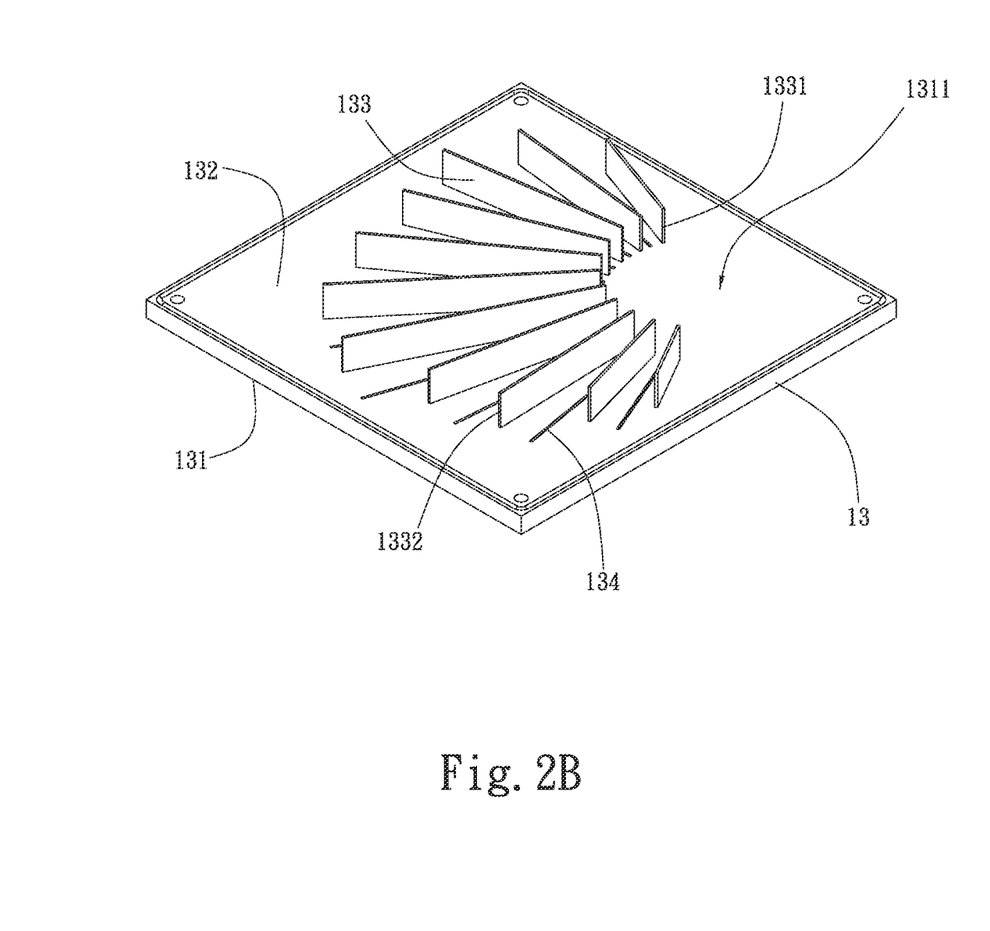
Figure 2C:
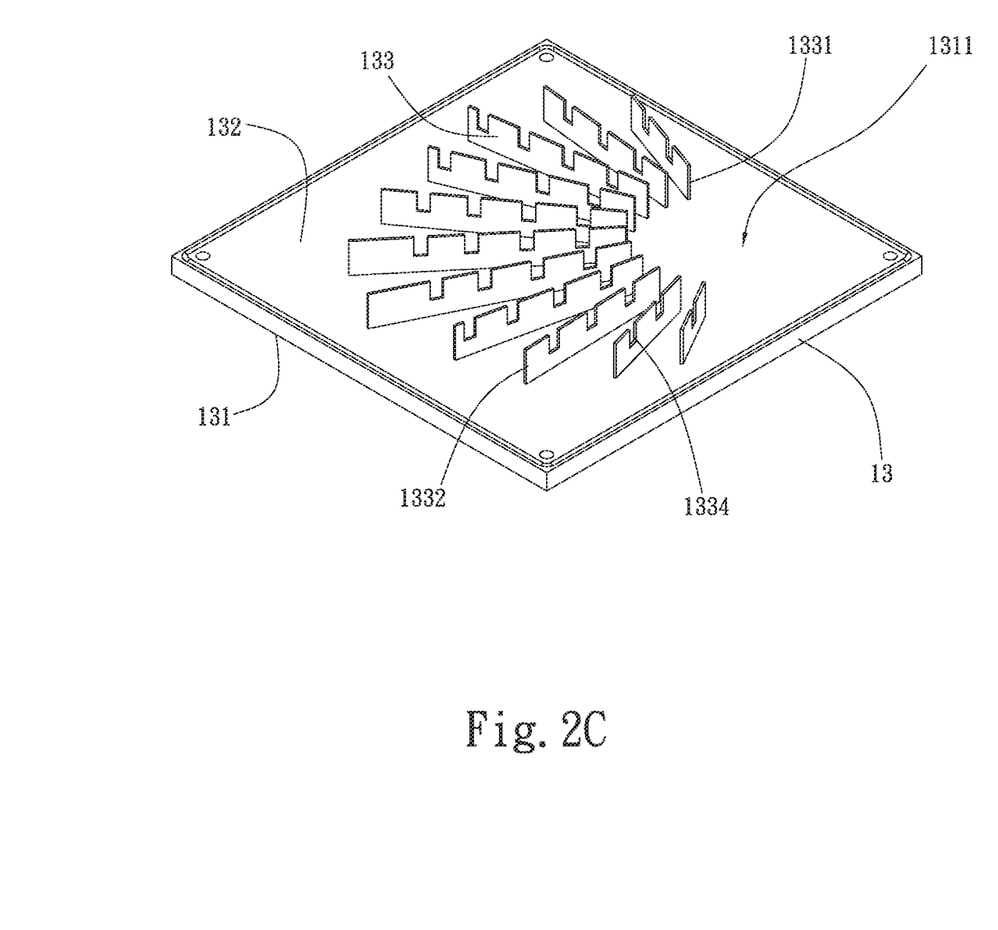
Figure 2D:
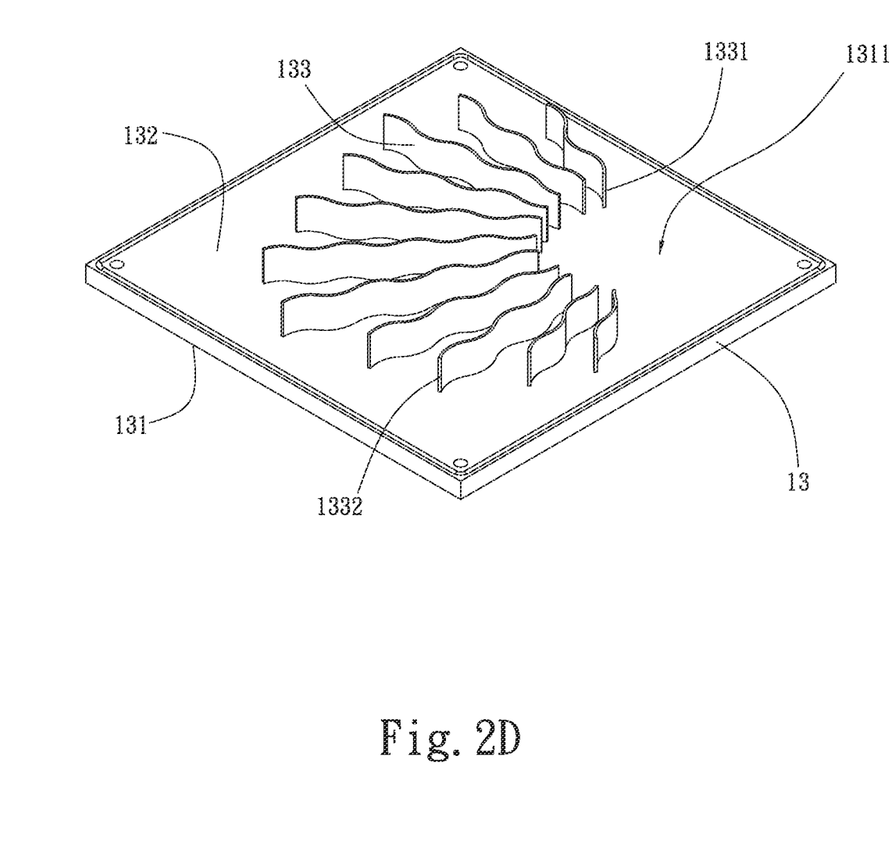

It should be especially noted that in FIG. 1A, all the radiating fins 133 have unified height. However, in another embodiment as shown in FIG. 2A, the radiating fins 133 respectively have different heights. In still another embodiment as shown in FIG. 2B, the heat exchange face 132 of the heat exchange component 13 is formed with multiple flow guide channels 134 between each two adjacent radiating fins 133 to help in guiding the cooling liquid. In still another embodiment as shown in FIG. 2C, each radiating fin 133 is formed with several notches 1334. In still another embodiment as shown in FIG. 2D, each radiating fin 133 has a waved form extending from the first end 1331 to the second end 1332.

Figure 3:
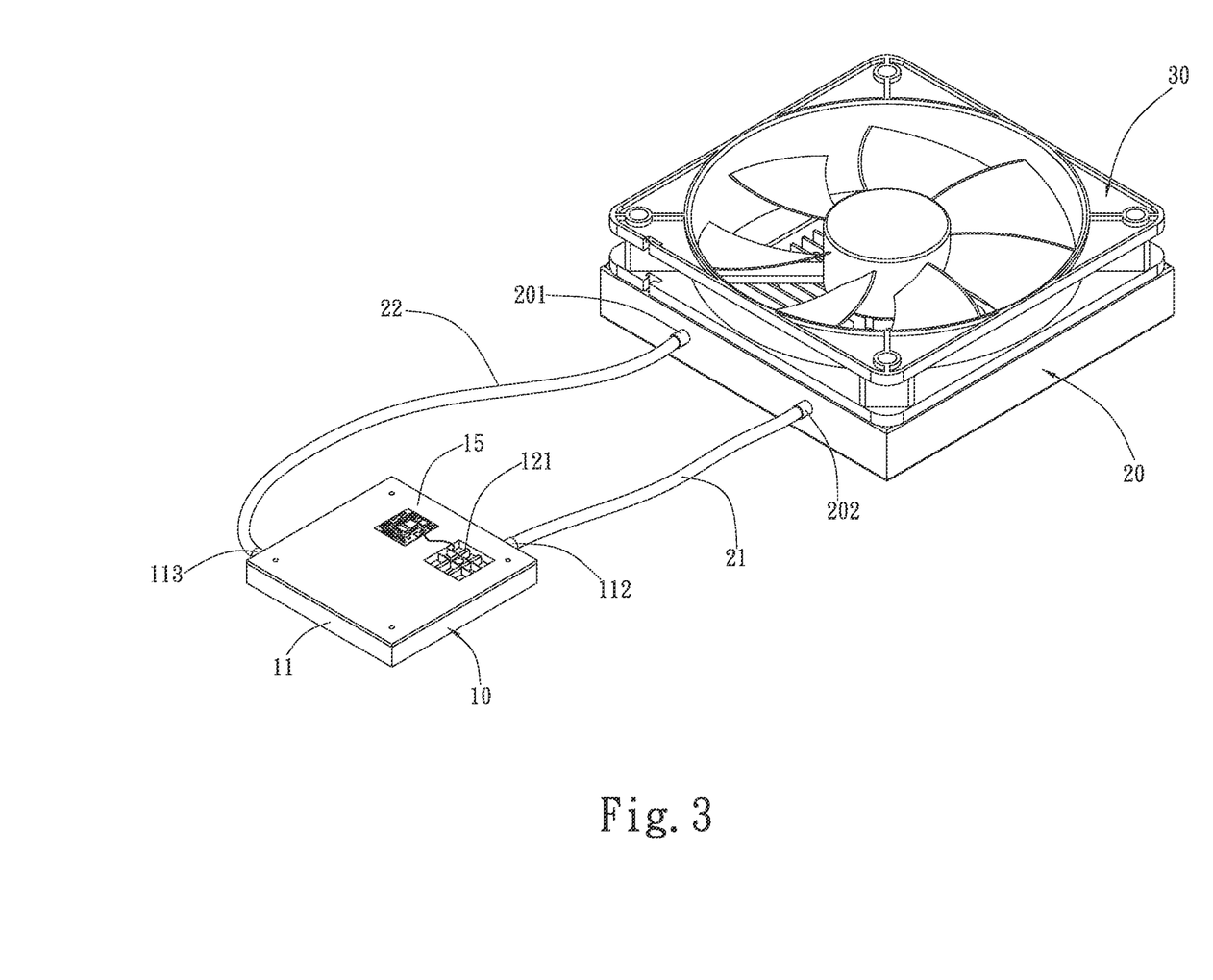
FIG. 3 is a perspective view showing that the present invention is connected with a heat sink.

Please now refer to FIG. 3, which is a perspective view showing that the first embodiment of the liquid-cooling device of the present invention is connected with a heat sink to form a liquid-cooling system. As shown in the drawing, a heat sink 20 is positioned in a position distal from the liquid reservoir case 11 of the liquid-cooling device 10. The heat sink 20 has a heat sink inlet 201 and a heat sink outlet 202. A first flexible pipe 21 and a second flexible pipe 22 are connected between the heat sink 20 and the liquid-cooling device 10. A first end of the first flexible pipe 21 is connected with the heat sink outlet 202, while a second end of the first flexible pipe 21 is connected with the inlet 112 of the liquid reservoir case 11. A first end of the second flexible pipe 22 is connected with the heat sink inlet 201, while a second end of the second flexible pipe 22 is connected with the outlet 113 of the liquid reservoir case 11. In addition, the heat sink 20 is connected with a fan 30 to help in dissipating the heat of the heat sink 20. After the cooling liquid in the heat exchange chamber 111 is heated, the cooling liquid is exhausted from the outlet 113 to flow through the second flexible pipe 22 to the heat sink 20. Then, the cooling liquid passes through the heat sink 20 to dissipate the heat. Thereafter, the cooling liquid flows from the heat sink outlet 202 through the first flexible pipe 21 and the inlet 112 into the heat exchange chamber 111 of the liquid reservoir case 11. Accordingly, the cooling liquid is circulated to dissipate the heat generated by the heat generation component.

Figure 4A:
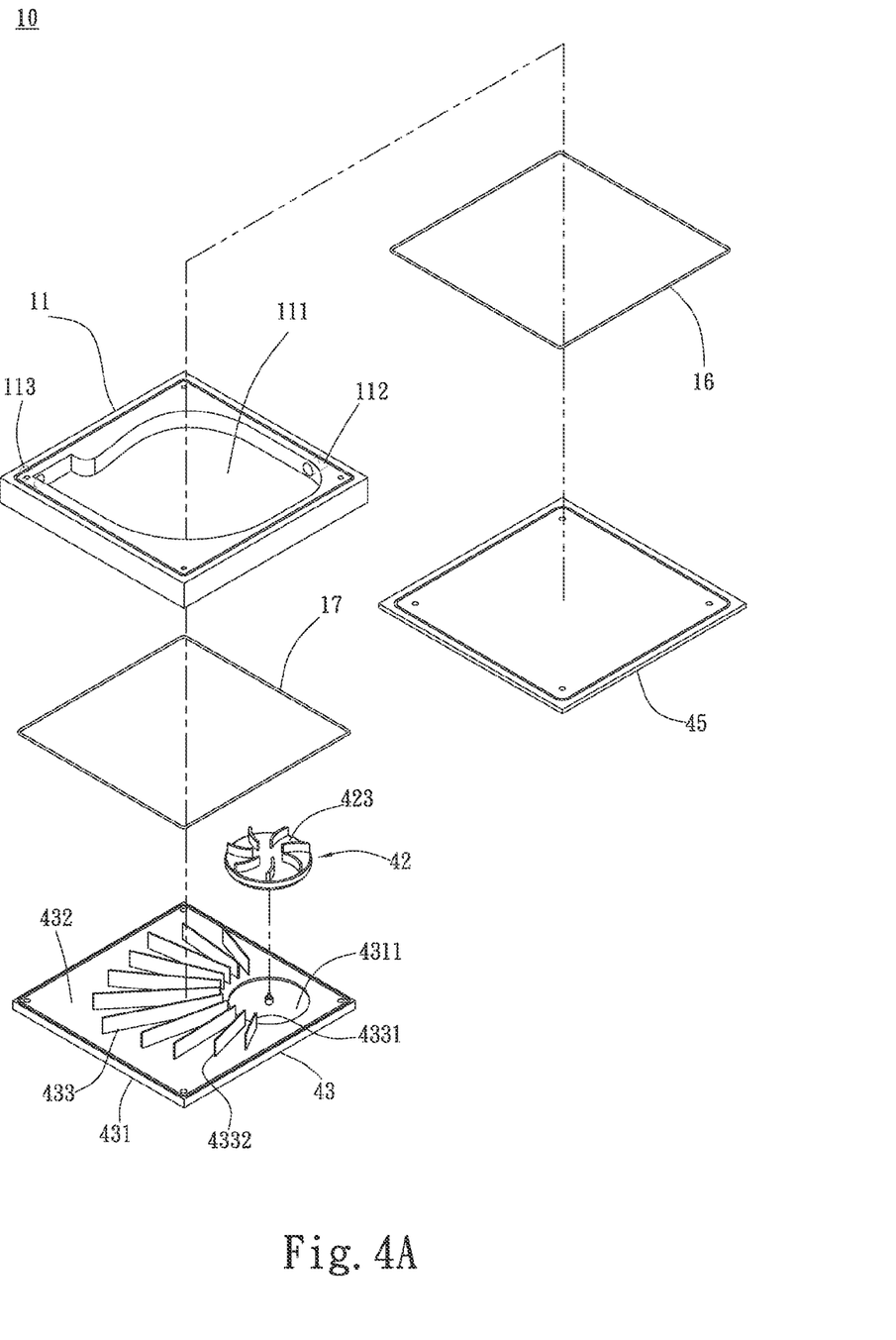
FIG. 4A is a perspective exploded view of a second embodiment of the present invention.
Figure 4B:
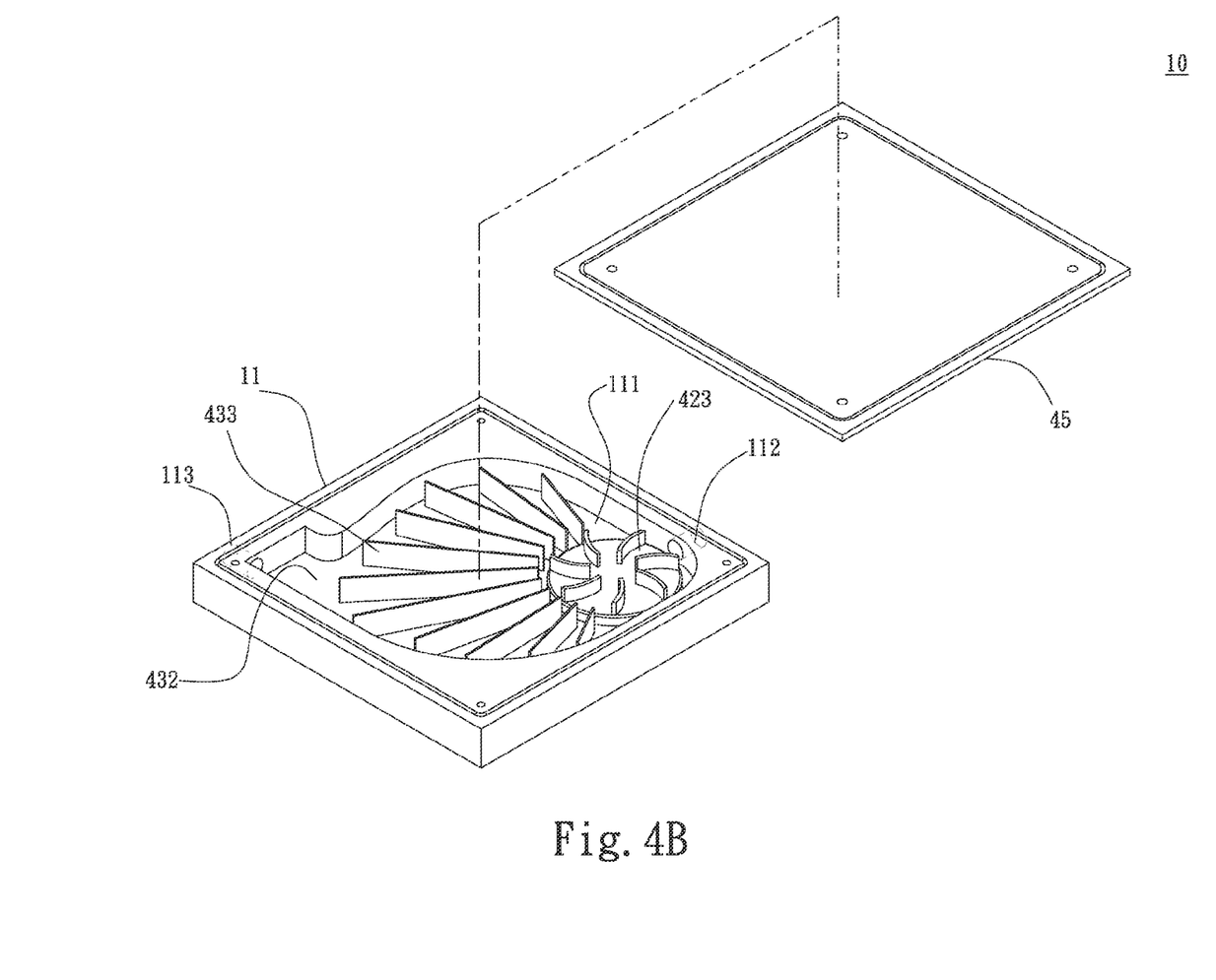
FIG. 4B is a perspective assembled view of the second embodiment of the present invention.
Figure 4C:
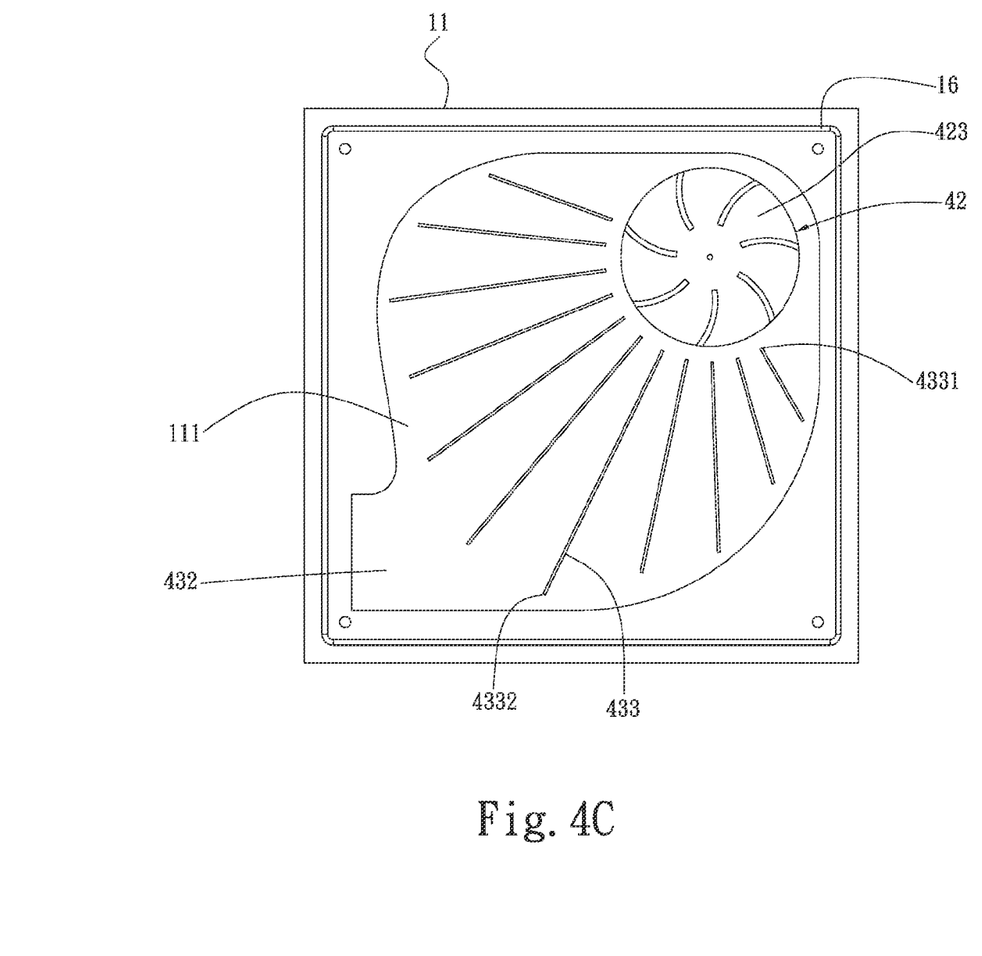
FIG. 4C is a top assembled view of the second embodiment of the present invention, showing that the frame body is assembled with the heat exchange component.
Figure 4D:
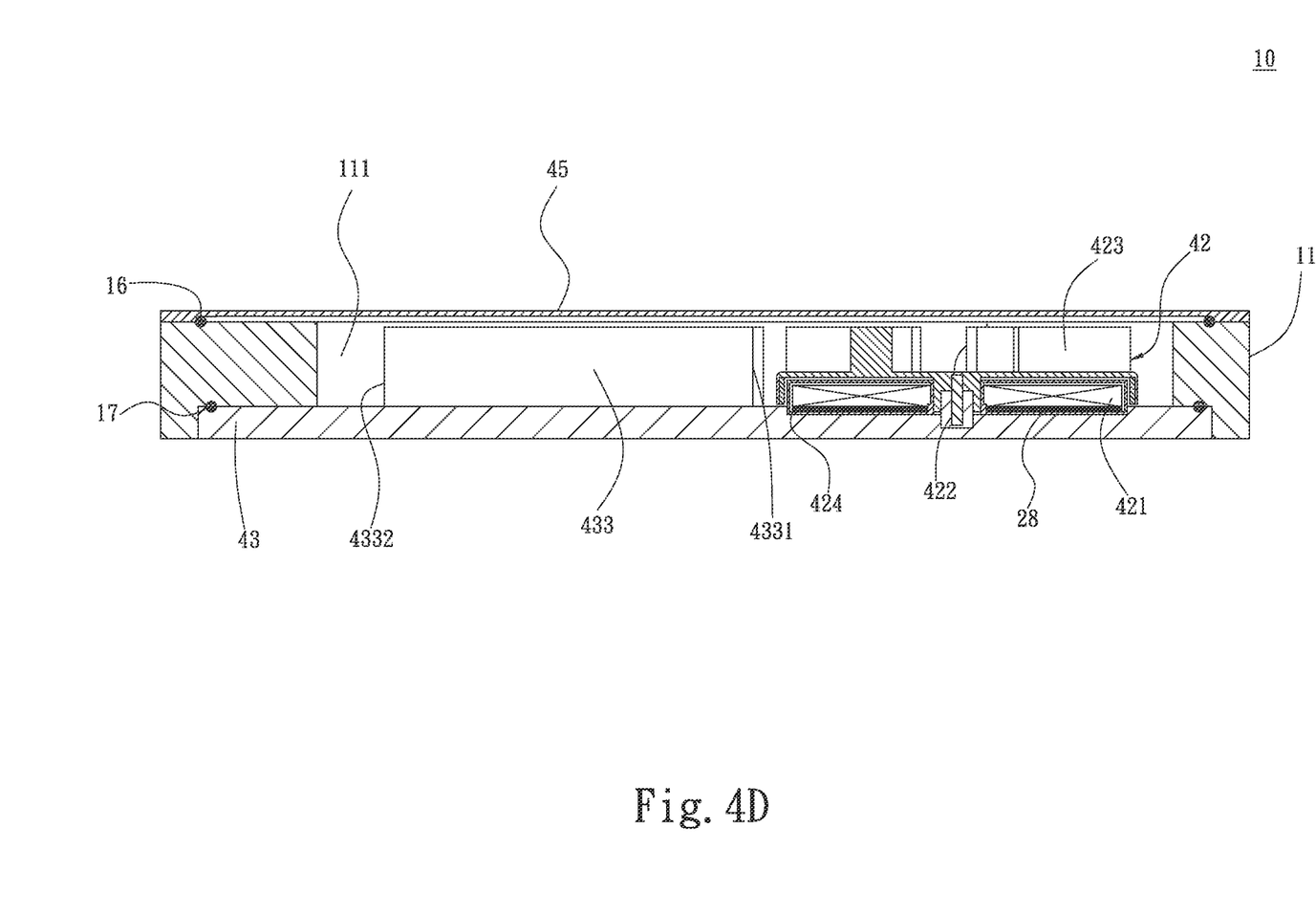
FIG. 4D is a sectional assembled view of the second embodiment of the present invention.

Please further refer to FIGS. 4A, 4B, 4C and 4D. FIG. 4A is a perspective exploded view of a second embodiment of the present invention. FIG. 4B is a perspective assembled view of the second embodiment of the present invention. FIG. 4C is a top assembled view of the second embodiment of the present invention, showing that the frame body is assembled with the heat exchange component. FIG. 4D is a sectional assembled view of the second embodiment of the present invention. The second embodiment is substantially identical to the first embodiment and the same components are denoted with the same reference numerals. As shown in the drawings, the second embodiment is different from the first embodiment in that the stator 421, the rotor 422 and the impeller 423 of the pump component 42 are all disposed in the heat exchange chamber 111. The stator 421 is enclosed in an isolation case 424 to prevent the cooling liquid in the heat exchange chamber 111 from contacting the stator 421. As shown in the drawings, the pump 42 is disposed on the heat exchange face 432 of the heat exchange component 43. The circuit board 28 is selectively disposed in the isolation case 424 as shown in FIG. 4D. The electrical wires of the circuit board 28 pass through the isolation case 424 and the liquid reservoir case 11 to connect with an external power supply (not shown). Alternatively, the circuit board 28 can be disposed on an outer face of the top board 45 and exposed to the environment. The electrical wires of the circuit board 28 can pass through the liquid reservoir case 11 and the isolation case 424 to connect with the stator 421 (not shown). The perforations of the isolation case 424 and the liquid reservoir case 11 through which the electrical wires pass are sealed to prevent the cooling liquid from flowing into the isolation case 422 and avoid leakage of the cooling liquid.

The heat exchange component 43 has a heat contact face 431 in contact with a heat generation component and a heat exchange face 432 in contact with the cooling liquid in the heat exchange chamber 11. Accordingly, the heat generated by the heat generation component can be transferred through the heat exchange component 43 to the cooling liquid in the heat exchange chamber 111. The heat exchange face 432 is defined with a water incoming section 4311 in adjacency to the inlet 112. The stator 421 is disposed on the water incoming section 4311. Multiple radiating fins 433 are disposed on the rest section of the heat exchange face 432. The radiating fins 433 are radially arranged at intervals. Each radiating fin 433 has a first end 4331 directed to the impeller 423 and a second end 4332 radially extending away from the water incoming section 4311. When the impeller 423 rotates to disturb the cooling liquid in the heat exchange chamber 111, the cooling liquid is driven by the impeller 423 to flow through the radiating fins 433 and then flow out from the outlet 113.

Figure 5A:
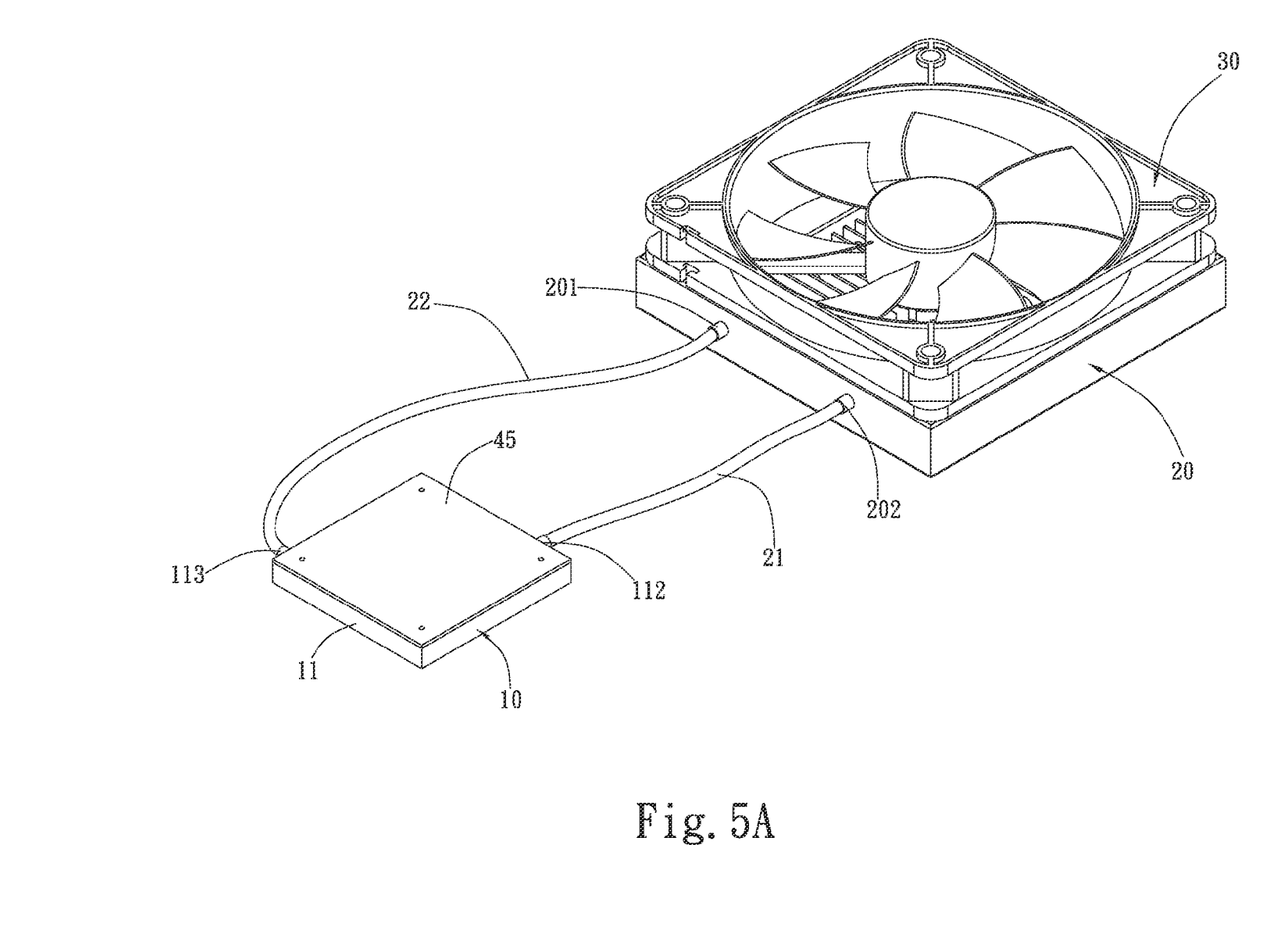
FIG. 5A is a perspective view showing that the second embodiment of the present invention is connected with a heat sink in a first state.
Figure 5B:
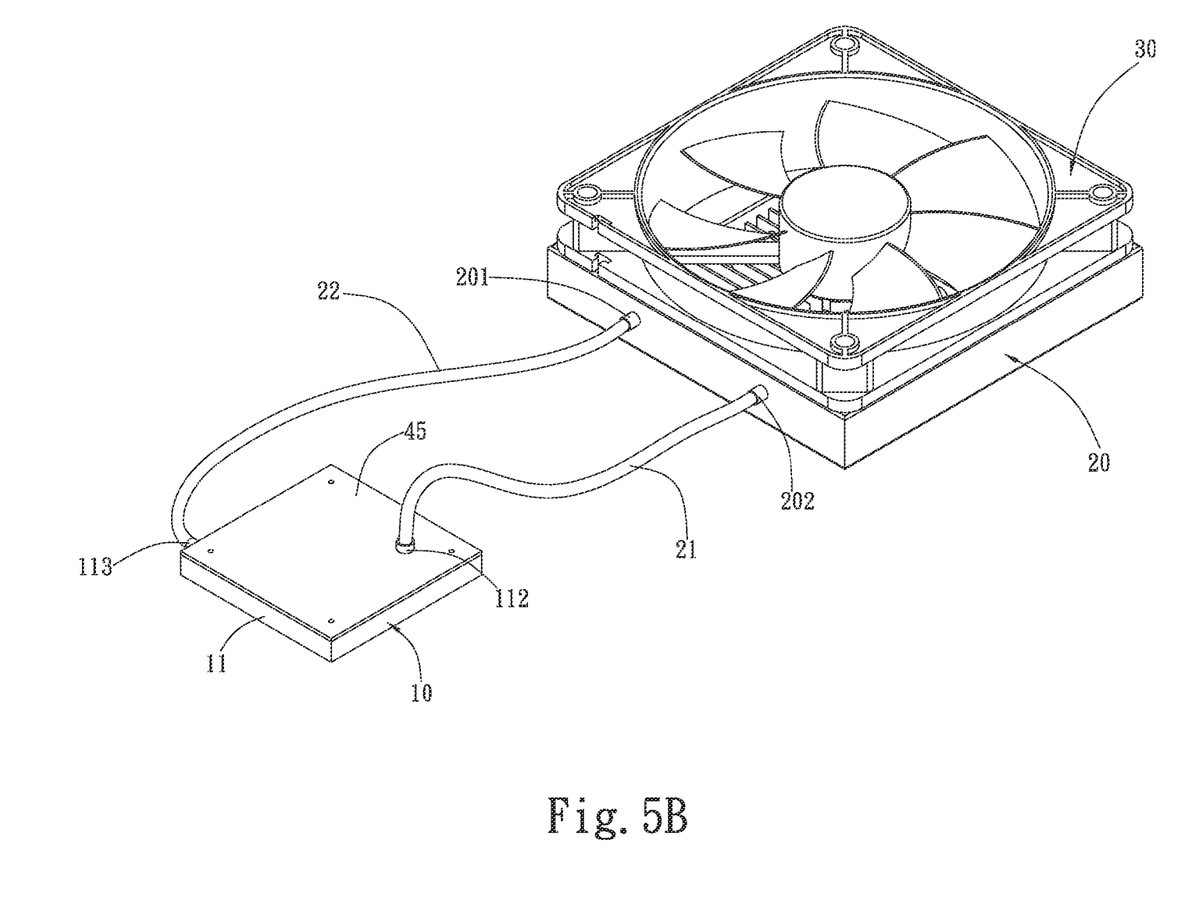
FIG. 5B is a perspective view showing that the second embodiment of the present invention is connected with a heat sink in a second state.

Please further refer to FIGS. 5A and 5B. FIG. 5A is a perspective view showing that the second embodiment of the present invention is connected with a heat sink in a first state. FIG. 5B is a perspective view showing that the second embodiment of the present invention is connected with a heat sink in a second state. As shown in FIG. 5A, the heat sink 20 is connected with the liquid-cooling device 10 in the same manner as the first embodiment as shown in FIG. 3. In addition, as shown in FIG. 5B, in the second embodiment, the inlet 112 of the liquid reservoir case 11 is disposed on the top board 45 corresponding to the pump component 42. According to such arrangement, the pump component 42 is positioned under the inlet 112 so that the impeller 423 of the pump component 42 can drive the cooling liquid incoming from the upper side to flow to the radiating fins 433.

According to the above arrangement, the pump and the multiple radiating fins are received in one single heat exchange chamber of the liquid-cooling device of the present invention. Therefore, the volume of the liquid-cooling device of the present invention is much smaller than the volume of the conventional liquid-cooling device. Moreover, the cooling efficiency of the liquid-cooling device of the present invention is higher than that of the conventional liquid-cooling device. Furthermore, the manufacturing cost of the liquid-cooling device of the present invention is lower than that of the conventional liquid-cooling device so that the yield can be increased. In addition, the impeller of the pump component is disposed in a position spaced from the central region of the heat exchange chamber and the radiating fins are positioned in adaptation to the impeller. Accordingly, the cooling liquid driven by the impeller can quickly circularly pass through the radiating fins.

The present invention has been described with the above embodiments thereof and it is understood that many changes and modifications in the above embodiments can be carried out without departing from the scope and the spirit of the invention that is intended to be limited only by the appended claims.

What is claimed is:

1. A liquid-cooling device comprising:
   a liquid reservoir case having a heat exchange chamber, an inlet and an outlet, the inlet and the outlet being in communication with the heat exchange chamber, the heat exchange chamber being for a cooling liquid to pass through;
   a pump component for circulating the cooling liquid, the pump component including a stator, a rotor and an impeller connected with the rotor, the rotor and the impeller being disposed in the heat exchange chamber in a position spaced from a central region of the heat exchange chamber, the impeller being positioned in adjacency to the inlet and exposed to the cooling liquid in the heat exchange chamber; and
   a heat exchange component connected with the liquid reservoir case as a bottom side of the heat exchange chamber, the heat exchange component having a heat contact face and a heat exchange face in contact with the cooling liquid in the heat exchange chamber, the heat exchange face being defined with a water incoming section corresponding to the impeller, multiple radiating fins being disposed on the rest section of the heat exchange face, wherein the radiating fins are radially arranged at intervals, each radiating fin having a first end directed to the impeller and a second end radially extending away from the water incoming section, a first spacing formed between the first end of each radiating fin, and a second spacing formed between the second end of each radiating fin, the first spacing narrower than the second spacing.

2. The liquid-cooling device as claimed in claim 1, wherein the liquid reservoir case has a top board serving as a top side of the heat exchange chamber opposite to the heat exchange component, the heat exchange chamber being positioned between the top board and the heat exchange component.

3. The liquid-cooling device as claimed in claim 1, wherein each radiating fin has a waved form extending from the first end to the second end.

4. The liquid-cooling device as claimed in claim 1, wherein the radiating fins respectively have unified or different heights.

5. The liquid-cooling device as claimed in claim 1, wherein the heat exchange face of the heat exchange component is formed with multiple flow guide channels between each two adjacent radiating fins.

6. The liquid-cooling device as claimed in claim 2, wherein the stator is disposed outside the heat exchange chamber and the top board serves to isolate the cooling liquid in the heat exchange chamber from the stator.

7. The liquid-cooling device as claimed in claim 1, wherein the stator is disposed in the heat exchange chamber and positioned on the heat exchange face of the heat exchange component.

8. A liquid-cooling system comprising:
   a liquid reservoir case having a heat exchange chamber, an inlet and an outlet, the inlet and the outlet being in communication with the heat exchange chamber, the heat exchange chamber being for a cooling liquid to pass through;
   a pump component for circulating the cooling liquid, the pump component including a stator, a rotor and an impeller connected with the rotor, the rotor and the impeller being disposed in the heat exchange chamber in a position spaced from a central region of the heat exchange chamber, the impeller being positioned in adjacency to the inlet and exposed to the cooling liquid in the heat exchange chamber;
   a heat exchange component connected with the liquid reservoir case as a bottom side of the heat exchange chamber, the heat exchange component having a heat contact face and a heat exchange face in contact with the cooling liquid in the heat exchange chamber, the heat exchange face being defined with a water incoming section corresponding to the impeller, multiple radiating fins being disposed on the rest section of the heat exchange face; and
   a heat sink connected with the liquid reservoir case for dissipating the heat of the cooling liquid.

9. The liquid-cooling system as claimed in claim 8, wherein a first flexible pipe is connected between the heat sink and the inlet of the liquid reservoir case and a second flexible pipe is connected with the heat sink and the outlet of the liquid reservoir case, the heat sink being positioned in a position distal from the liquid reservoir case.

* * * * *